(12) United States Patent
Akiyama et al.

(10) Patent No.: US 11,668,747 B2
(45) Date of Patent: Jun. 6, 2023

(54) CONTROL METHOD OF INSPECTION APPARATUS AND INSPECTION APPARATUS

(71) Applicant: Tokyo Electron Limited, Tokyo (JP)

(72) Inventors: Naoki Akiyama, Yamanashi (JP); Hiroyuki Nakayama, Yamanashi (JP)

(73) Assignee: Tokyo Electron Limited, Tokyo (JP)

(*) Notice: Subject to any disclaimer, the term of this patent is extended or adjusted under 35 U.S.C. 154(b) by 0 days.

(21) Appl. No.: 17/443,359

(22) Filed: Jul. 26, 2021

(65) Prior Publication Data
US 2022/0043055 A1 Feb. 10, 2022

(30) Foreign Application Priority Data

Aug. 7, 2020 (JP) .............................. JP2020-135238

(51) Int. Cl.
G01R 1/04 (2006.01)
G01R 31/308 (2006.01)
G01R 1/073 (2006.01)
G01R 1/02 (2006.01)

(52) U.S. Cl.
CPC ....... *G01R 31/308* (2013.01); *G01R 1/07307* (2013.01); *G01R 1/025* (2013.01); *G01R 1/04* (2013.01)

(58) Field of Classification Search
CPC ...... G01R 1/04; G01R 1/025; G01R 1/07307; G01R 31/308
USPC .......................................... 324/96
See application file for complete search history.

(56) References Cited

U.S. PATENT DOCUMENTS

2013/0278279 A1* 10/2013 Ishii ................... G01R 1/07342
324/750.03
2021/0033666 A1* 2/2021 Kasai .................... H05B 45/40

FOREIGN PATENT DOCUMENTS

JP 2019-102645 6/2019

* cited by examiner

*Primary Examiner* — Jermele M Hollington
*Assistant Examiner* — Courtney G McDonnough
(74) *Attorney, Agent, or Firm* — IPUSA, PLLC

(57) ABSTRACT

A control method of an inspection apparatus including a mounting stage on which a substrate having a plurality of inspection objects is mounted, a plurality of sections being formed with respect to the mounting stage and a heater controllable to heat for each of the sections includes when inspecting a first inspection object to be inspected among the plurality of inspection objects, causing the heater to heat a section corresponding to the first inspection object and a section corresponding to a second inspection object to be inspected next.

9 Claims, 4 Drawing Sheets

CONTROL METHOD OF INSPECTION APPARATUS AND INSPECTION APPARATUS

CROSS-REFERENCE TO RELATED APPLICATION

The present application is based upon and claims priority to Japanese Patent Application No. 2020-135238, filed on Aug. 7, 2020, the entire contents of which are incorporated herein by reference.

BACKGROUND OF THE INVENTION

1. Field of the Invention

The present disclosure relates to a control method of an inspection apparatus and an inspection apparatus.

2. Background Art

There is a known inspection apparatus that inspects the electrical characteristics of an electronic device by mounting, on a mounting stage, a wafer on which the electronic device is formed or a carrier on which the electronic device is arranged and supplying current to the electronic devices from a tester through probes or the like. A temperature adjustment mechanism provided on the mounting table controls the temperature of the electronic device.

Patent Document 1 discloses a prober that includes a stage configured to place thereon a substrate formed with a plurality of chips provided in a matrix; a contact that sequentially contacts with electrode pads of the plurality of chips thereby performing an inspection on electrical characteristic of the plurality of chips; a plurality of LED units provided on a side opposite to a placing surface of the stage so as to independently heat a plurality of areas where the plurality of chips are located, respectively, and each including one or a plurality of LEDs; and a controller that outputs a control signal to drive, among the plurality of LED units, at least an LED unit corresponding to an area of a chip to be inspected, among the area of the chip to be inspected and peripheral areas of the corresponding area.

PRIOR ART DOCUMENT

Patent Document

[Patent Document 1] Japanese Laid-open Patent Publication No. 2019-102645

Here, in an inspection apparatus (prober) that heats the entire substrate to a target temperature, alignment is performed after converging the displacement due to thermal expansion after an elapse of a predetermined time from reaching the target temperature. On the other hand, in an inspection apparatus (prober) that partially heats the substrate using a LED unit, the temperature is partially increased for each electronic device to be inspected, and thus displacement due to thermal expansion occurs with each partial increase in temperature. Therefore, after the partial increase in temperature and before alignment, the inspection apparatus waits until the displacement due to thermal expansion converges, and thus the throughput of the inspection apparatus decreases.

In one aspect, the present disclosure provides a control method of an inspection apparatus and an inspection apparatus to enhance throughput.

SUMMARY OF THE INVENTION

In view of the above, according to one aspect, A control method of an inspection apparatus including a mounting stage on which a substrate having a plurality of inspection objects is mounted, a plurality of sections being formed with respect to the mounting stage and a heater controllable to heat for each of the sections includes when inspecting a first inspection object to be inspected among the plurality of inspection objects, causing the heater to heat a section corresponding to the first inspection object and a section corresponding to a second inspection object to be inspected next.

According to one aspect, it is possible to provide a control method of an inspection apparatus and an inspection apparatus to enhance throughput.

DESCRIPTION OF THE EMBODIMENTS

Figure 1:
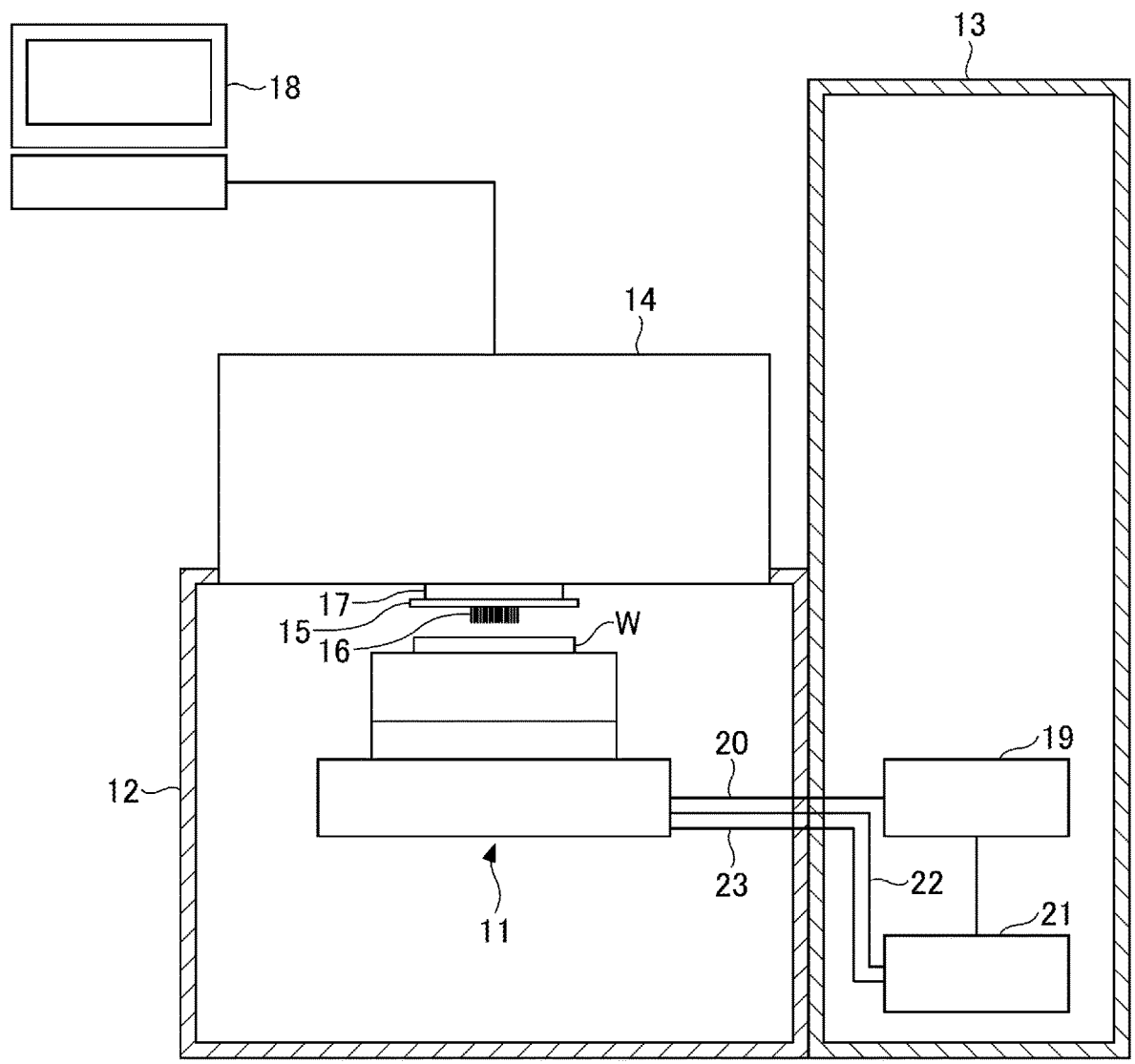
FIG. 1 is a cross-sectional view illustrating a configuration of an inspection apparatus according to the present embodiment.

In the following, an embodiment for carrying out the present disclosure will be described with reference to the drawings. In each drawing, the same components are indicated by the same reference numerals and overlapping descriptions may be omitted.

<Inspection Apparatus>

An inspection apparatus 10 including a stage (mounting stage) 11 according to the present embodiment will be described with reference to FIG. 1. FIG. 1 is an example of a cross-sectional view illustrating a configuration of the inspection apparatus 10 according to the present embodiment.

The inspection apparatus 10 is an apparatus that inspects electrical characteristics of each of a plurality of electronic devices (inspection objects, chips) formed on a wafer (a substrate) W. It should be noted that the substrate having the inspections objects is not limited to the wafer W, but may be a carrier on which electronic devices are arranged, a glass substrate, a chip, or the like. The inspection apparatus 10 includes a chamber 12 that houses a stage 11 on which the wafer W is mounted, a loader 13 arranged adjacent to the chamber 12, and a tester 14 arranged over the chamber 12.

The chamber 12 has a housing shape with a hollow inside. Inside the chamber 12, the stage 11 for mounting the wafer W and a probe card 15 that is arranged to face the stage 11 are accommodated. The probe card 15 has a number of needle-shaped probes (contact terminals) 16 arranged corresponding to electrode pads or solder bumps provided corresponding to electrodes of the respective electronic devices of the wafer W.

The stage 11 includes a fixation mechanism (not illustrated) that fixes the wafer W to the stage 11. Thereby, a positional deviation of the wafer W relative to the stage 11 is prevented. The chamber 12 is also provided with a movement mechanism (not illustrated) that moves the stage 11 in the horizontal direction and in the vertical direction. Thereby, the relative position between the probe card 15 and the wafer W is adjusted so that electrode pads or solder bumps provided corresponding to the electrodes of the respective electronic devices contact the respective probes 16 of the probe card 15.

The loader 13 takes out the wafer W on which the electronic devices are arranged from a FOUP (not illustrated) that is a transportation container to mount the wafer W on the stage 11 inside the chamber 12, and removes the inspected wafer W from the stage 11 to house the wafer W in the FOUP.

The probe card 15 is connected to the tester 14 via an interface 17. Also, when the respective probes 16 contact the electrode pads or solder bumps provided corresponding to the electrodes of the respective electronic devices of the wafer W, the respective probes supply electric power from the tester 14 to the electronic devices via the interface 17 or transmit signals from the electronic devices via the interface 17 to the tester 14.

The tester 14 includes a test board (not illustrated) that reproduces a part of a circuit configuration of a motherboard on which an electronic device is mounted, and the test board is connected to a tester computer 18 that determines whether the electronic device is good or bad based on signals from the electronic device. The tester 14 can reproduce the circuit configurations of a plurality of types motherboards by replacing the test board.

The controller 19 controls the operation of the stage 11. The controller 19 controls the movement mechanism (not illustrated) of the stage 11 to move the stage 11 in the horizontal direction and in the vertical direction. Also, the controller 19 is connected to the stage 11 by wiring 20. The controller 19 controls the operation of a light emission mechanism 40, which will be described later below, through the wiring 20.

The heat medium supply device 21 is connected to the heat medium flow path 33 of the stage 11 via a forward pipe 22 and a return pipe 23, and can circulate a heat medium between the heat medium supply device 21 and the heat medium flow path 33 of the stage 11. The controller 19 controls the heat medium supply device 21 to control the temperature, the flow rate, and the like of the heat medium supplied from the heat medium supply device 21 to the heat medium flow path 33.

It should be noted that the controller 19 and the heat medium supply device 21 are illustrated as being provided in the loader 13. However, the present disclosure is not limited thereto, and the controller 19 and the heat medium supply device 21 may be provided at other positions.

According to the inspection apparatus 10, when inspecting the electrical characteristics of an electronic device, the tester computer 18 transmits data to the test board connected to the electronic device via each probe 16, and further determines whether the transmitted data has been processed correctly by the test board based on an electrical signal from the test board.

Figure 2:
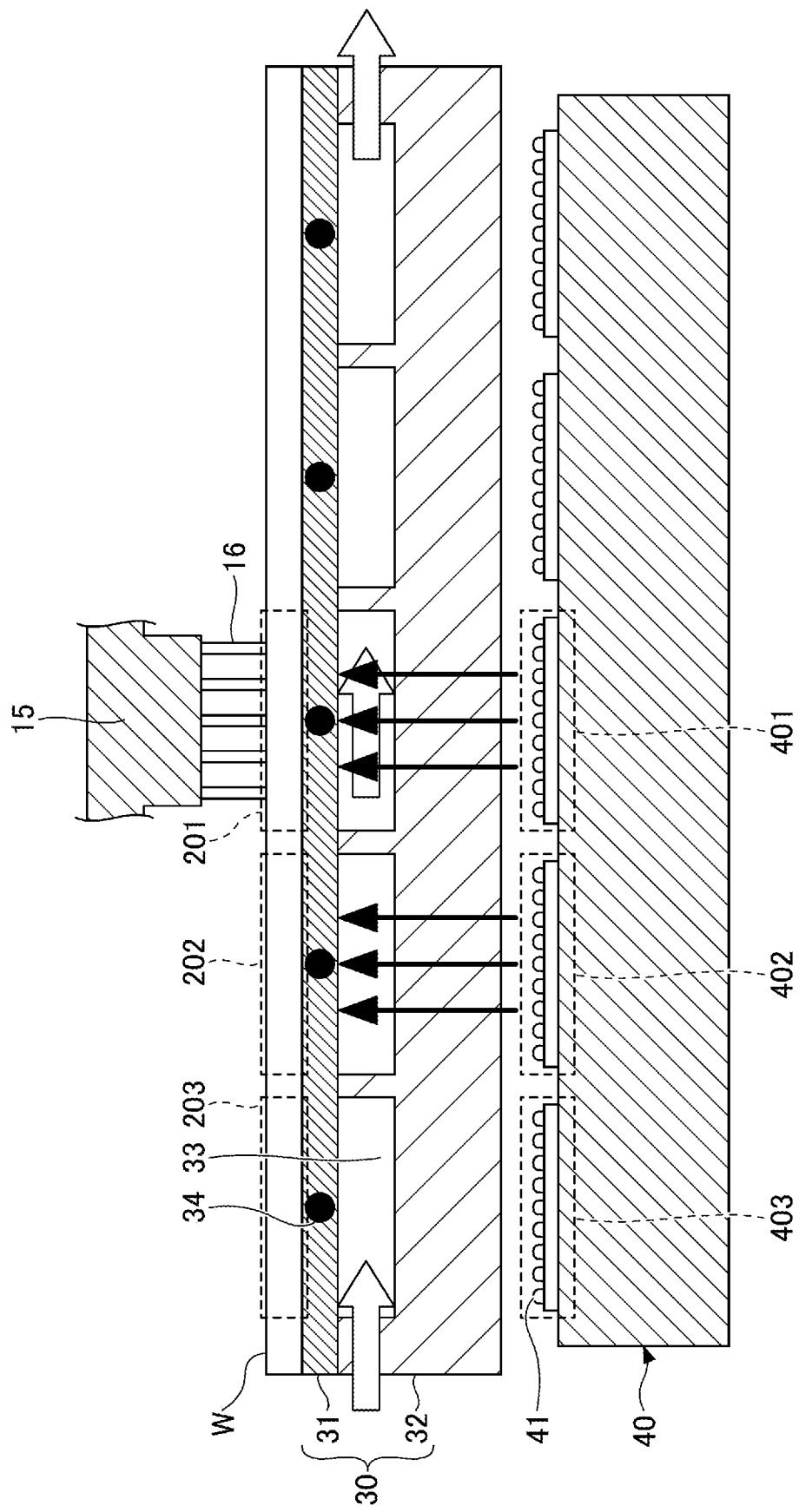
FIG. 2 is an example of a cross-sectional view illustrating a temperature adjustment mechanism of a wafer in the inspection apparatus according to the present embodiment.

Next, a temperature adjustment mechanism of the wafer W in the inspection apparatus 10 according to the present embodiment will be described with reference to FIG. 2. FIG. 2 is an example of a cross-sectional view illustrating a temperature adjustment mechanism of the wafer W in the inspection apparatus 10 according to the present embodiment. It should be noted that in FIG. 2, the flow of the heat medium is indicated by the white arrows. Also, in FIG. 2, an example of the light emitted from the light emission mechanism 40 is illustrated by the solid arrows.

The stage 11 includes a mounting section 30 and a light emission mechanism 40. Also, the mounting section 30 includes a plate member 31 and a translucent member 32.

The plate member 31 is a member on which the wafer W is mounted and is formed in a substantially disc shape.

The translucent member 32 transmits light emitted from the light emission mechanism 40. Also, at the upper surface of the translucent member 32, a recessed groove is formed, and the plate member 31 and the translucent member 32 are adhered or bonded to form the heat medium flow path 33. To the heat medium flow path 33, the heat medium is supplied from the heat medium supply device 21 (see FIG. 1) via a forward pipe 22 (see FIG. 1). The heat medium flowing through the heat medium flow path 33 is returned to the heat medium supply device 21 via the return line 23 (see FIG. 1). It should be noted that the heat medium flow path 33 may be configured by forming a recessed groove on the lower surface side of the plate member 31 and adhering or bonding the plate member 31 and the translucent member 32. As the heat medium, for example, water or Galden, which is a colorless and light transmissive liquid, may be used.

Also, a plurality of temperature sensors 34 are provided in the plate member 31. The temperature detected by the temperature sensors 34 is transmitted to the controller 19.

The light emission mechanism 40 includes a plurality of LEDs 41 that emit light. The LEDs 41 are sectioned for respective predetermined areas (see FIG. 3, which will be described below) in a plan view. The controller 19 can control the lighting and the amount of light for each of the sectioned LEDs 41. It should be noted that although the light emission mechanism 40 is described as using LEDs 41 as light sources, the type of light source is not limited thereto.

The light emitted from the light emission mechanism 40 passes through the translucent member 32 and the heat medium flowing through the heat medium flow path 33 and is emitted to the back surface of the plate member 31, thereby heating the plate member 31. Then, by the heat transferring from the plate member 31 to the wafer W, the electronic devices formed on the wafer W are heated. It should be noted that the plate member 31 may also have a configuration formed of a translucent member that transmits light. In this case, the light emitted from the light emission mechanism 40 passes through the translucent member 32 and is emitted directly on the back surface of the wafer W, thereby increasing the temperature of the electronic devices formed on the wafer W.

Also, for the stage 11 (the plate member 31), a plurality of sections are formed corresponding to the sections for emitting light of the light emission mechanism 40. By controlling the sections where the LEDs are lighted, the light emission mechanism 40 can control the sections of the stage 11 (plate member 31) to be heated by the light emission mechanism 40. Thereby, it is possible to control heating of the wafer W mounted on the stage 11 for each of the sections.

The probes 16 contact an electrode of an electronic device. The tester 14 (see FIG. 1) can apply current to the circuit within the electronic device by applying a voltage to the electrode of the electronic device through the probes 16.

The wafer W has electronic devices (chips) to be inspected. In FIG. 2, electronic devices 201 to 203 are formed on the wafer W.

Figure 3:
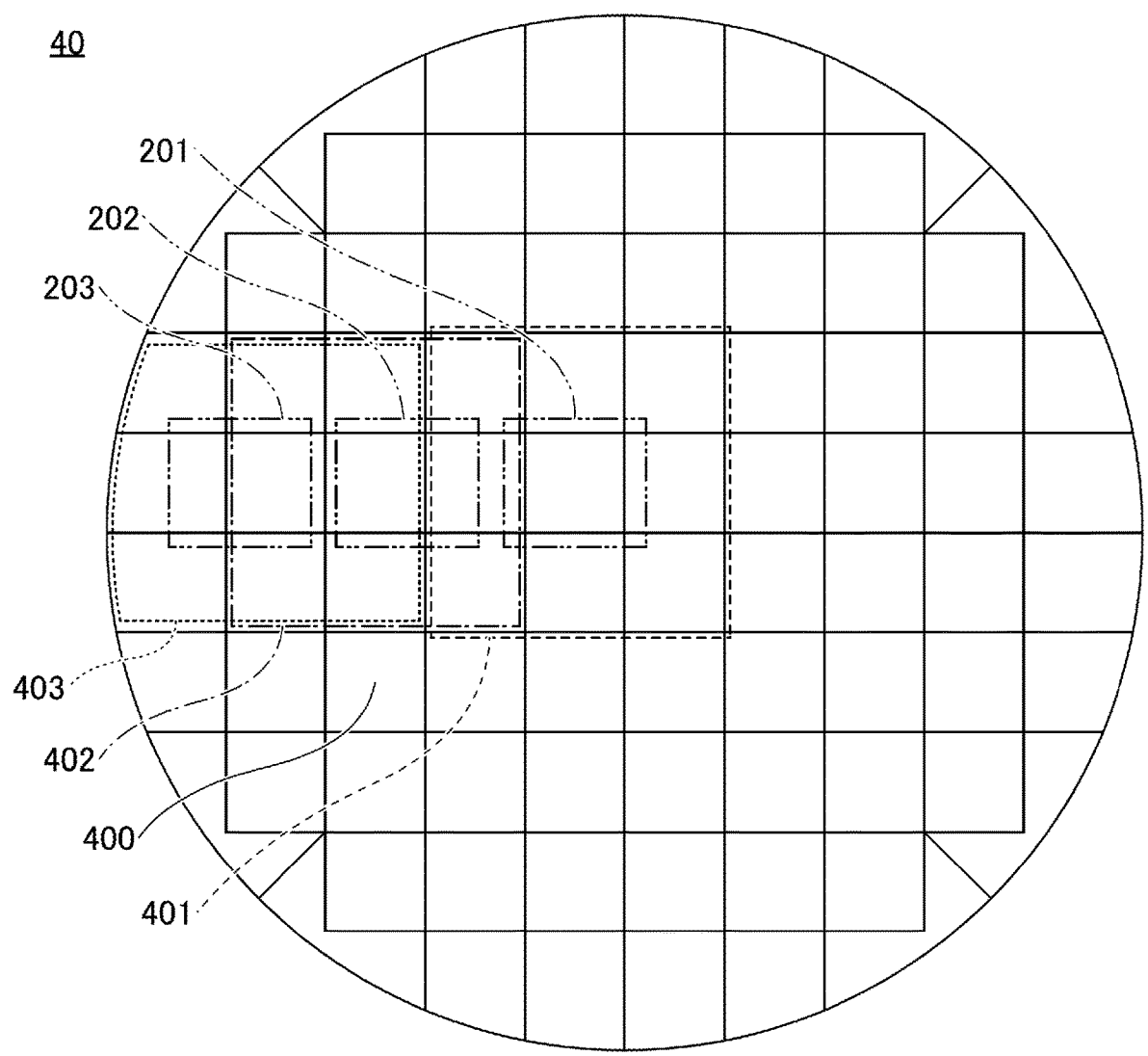
FIG. 3 is an example of a plan view illustrating an example of LED sections to emit light in a light emission mechanism.

Here, the light emission mechanism 40 will be described with reference to FIG. 3. FIG. 3 is an example of a plan view illustrating an example of LED sections to emit light in the light emission mechanism 40. It should be noted that in FIG. 3, the positions of the electronic devices 201 to 203 to be inspected in a plan view are indicated by the two-dot chain lines.

As illustrated in FIG. 3, the light emission mechanism 40 includes LED arrays 400 sectioned for respective predetermined areas. For each LED array 400, a plurality of LEDs 41 (see FIG. 2) are provided. The controller 19 can control the lighting and the amount of light of the LEDs 41 for each LED array 400.

The area of the LED arrays 400 that are lighted at the time of heating the electronic device 201 is indicated by the dashed line as the illumination area 401. For example, the illumination area 401 may be composed of the LED array 400 corresponding to the central position of the electronic device 201 and the surrounding LED arrays 400. Also, the area of the LED arrays 400 that are lighted at the time of heating the electronic device 202 is indicated by the dashed line as the illumination area 402. For example, the illumination area 402 may be composed of the LED array 400 corresponding to the central position of the electronic device 202 and the surrounding LED arrays 400. Also, the area of the LED arrays 400 that are lighted at the time of heating the electronic device 203 is indicated by the dashed line as the illumination area 403. For example, the illumination area 403 may be composed of the LED array 400 corresponding to the central position of the electronic device 203 and the surrounding LED arrays 400. It should be noted that in the illumination areas 401 to 403, some LED arrays 400 may overlap with the other illumination areas 401 to 403. Also, the illumination areas corresponding to the respective electronic devices may be different from each other. It should be noted that as illustrated in the example of FIG. 3, part of the illumination areas may overlap for one electronic device and another electronic device. Also, the illumination areas may not overlap for one electronic device and another electronic device. Also, one electronic device and another electronic device may match in the illumination area.

<Control of Inspection Apparatus>

Figure 4:
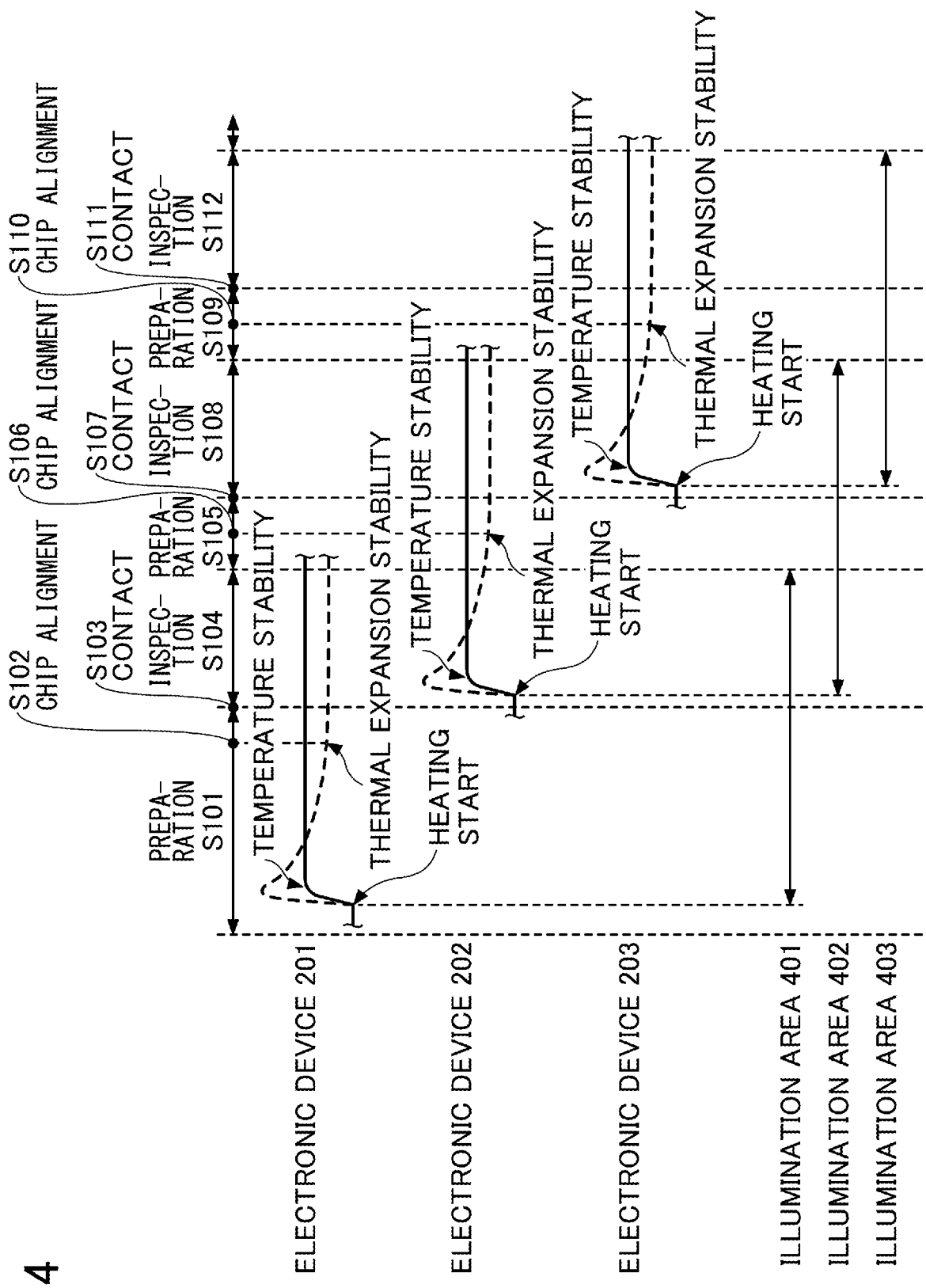
FIG. 4 is an example of a time chart illustrating a process of the inspection apparatus according to the present embodiment.

Next, control of the inspection apparatus 10 according to the present embodiment will be described with reference to FIG. 4. FIG. 4 is an example of a time chart illustrating a process of the inspection apparatus 10 according to the present embodiment. Here, an example is described in which the wafer W includes electronic devices 201 to 203, and the inspection apparatus 10 performs inspection in the order of the electronic device 201, the electronic device 202, and the electronic device 203. Also, in FIG. 4, the horizontal axis represents time. For each of the electronic devices 201 to 203, the temperature is indicated by the solid line and the displacement due to thermal expansion is indicated by the dashed line. Also, for the illumination areas 401 to 403, the zones where the LED arrays 400 are lighted are indicated by the arrows.

In the example illustrated in FIG. 4, the controller 19 executes a preparation step S101 for inspecting the electronic device 201, an inspection step S104 of inspecting the electronic device 201, a preparation step S105 for inspecting the electronic device 202, an inspection step S108 of inspecting the electronic device 202, a preparation step S109 for inspecting the electronic device 203, and an inspection step S112 of inspecting the electronic device 203.

In the preparation step S101, the wafer W is transported from the loader 13 to the chamber 12, and the wafer W is mounted on the stage 11. A fixation mechanism (not illustrated) of the stage 11 fixes the mounted wafer W to stage 11. A heat medium having a predetermined temperature flows through the heat medium flow path 33, and the entire wafer W mounted on the stage 11 is heated to a predetermined first temperature. It should be noted that the first temperature is a temperature (which may be, for example, 70° C.) that is lower than a predetermined second temperature (target temperature, which may be, for example, 80° C.) at the time of inspecting the electronic device. Upon an elapse of a predetermined time after the temperature of the wafer W detected by the temperature sensor 34 has stabilized at the first temperature, the controller 19 determines that the displacement due to the thermal expansion of the wafer W has stabilized (converged). Then, upon determining that the displacement due to thermal expansion of the wafer W has stabilized (converged), the controller 19 aligns the wafer W (wafer alignment). Here, for example, the positional deviation in the horizontal direction (the X and Y directions) of the wafer W, the positional deviation in the vertical direction (the Z direction) of the wafer W, and the positional deviation in the rotation direction (the $\theta_z$ direction) of the wafer W with the vertical direction as the rotation axis may be aligned.

Then, in the preparation step S101, the controller 19 controls the light emission mechanism 40 to light the LED arrays 400 of the illumination area 401 for heating the electronic device 201 to start heating the electronic device 201. The controller 19 may also control the amount of light of the LED arrays 400 in the illumination area 401 such that the temperature of the electronic device 201 becomes the target temperature based on the detected value of the temperature sensors 34. Thus, the temperature of the electronic device 201 is increased to the target temperature and is then maintained at the target temperature, as indicated by the solid line in FIG. 4.

Also, by the electronic device 201 being heated, the electronic device 201 is displaced by thermal expansion, as illustrated by the dashed line in FIG. 4. The displacement due to the thermal expansion of the electronic device 201 has stabilized (converged) with the passage of time. Here, the time indicated by the dashed line from the start of the heating to the stabilization of the displacement due to thermal expansion is longer than the time indicated by the solid line from the start of the heating to the stabilization of the temperature.

Upon an elapse of a predetermined time after the temperature of the electronic device 201 detected by the temperature sensor 34 has stabilized at the target temperature, the controller 19 determines that the displacement due to the thermal expansion of the electronic device 201 has stabilized (converged). It should be noted that the predetermined time is determined in advance by experiments, simulations, or the like, and stored in the controller 19. Upon determining that the displacement due to the thermal expansion of the electronic device 201 has stabilized (converged), the controller 19 performs alignment (chip alignment) S102 of the electronic device 201 to be inspected. Here, for example, the positional deviation in the horizontal direction (the X and Y directions) of the electronic device 201 to be inspected, the positional deviation in the vertical direction (the Z direction) of the electronic device 201 to be inspected, and the positional deviation in the rotation direction (the $\theta_z$ direction) of the electronic device 201 to be inspected with the vertical direction as the rotation axis may be aligned.

The controller 19 controls the movement mechanism (not illustrated) of the stage 11 to make contact S103 between an electrode of the electronic device 201 to be inspected and the probes 16. Here, because alignment is performed in accordance with the thermal expansion of the electronic device 201 to be inspected, positional adjustment between the electrode of the electronic device 201 and the probes 16 can be reliably performed. Also, the contact pressure between the electrode of the electronic device 201 and the probes 16 can be set to a preferable pressure.

Next, in the inspection step S104, the tester 14 inspects the electronic device 201, to be inspected, connected through the probes 16. At this time, the controller 19 may control the amount of light of the LED arrays 400 within the illumination area 401 so that the temperature of the electronic device 201 becomes the target temperature based on the detected value of the temperature sensor 34. Upon completion of the inspection of the electronic device 201, the LED arrays 400 of the illumination area 401 are turned off.

Also, in the inspection step S104, the controller 19 controls the light emission mechanism 40 to light the LED arrays 400 of the illumination area 402 for heating the electronic device 202, which is to be inspected next, to start heating the electronic device 202. Also, the controller 19 may control the amount of light of the LED arrays 400 within the illumination area 402 so that the temperature of the electronic device 202 becomes the target temperature based on the detected value of the temperature sensor 34. Thus, the temperature of the electronic device 202 is increased to the target temperature and is then maintained at the target temperature, as indicated by the solid line in FIG. 4.

Also, by the electronic device 202 being heated, the electronic device 202 is displaced by thermal expansion, as illustrated by the dashed line in FIG. 4. The displacement due to the thermal expansion of the electronic device 202 stabilizes (converges) with the passage of time.

In the preparation step S105, preparation is performed for inspecting the electronic device 202. Upon an elapse of the predetermined time after the temperature of the electronic device 201 detected by the temperature sensor 34 stabilizes at the target temperature, the controller 19 determines that the displacement due to the thermal expansion of the electronic device 202 has stabilized (converged). Upon determining that the displacement due to the thermal expansion of the electronic device 202 has stabilized (converged), the controller 19 performs alignment (chip alignment) S106 of the electronic device 202 to be inspected next.

Here, during the inspection of the electronic device 201, the electronic device 202 to be inspected next is heated in advance. Accordingly, in the preparation step S105, the alignment S106 of the electronic device 202 can be performed in a state in which the displacement due to the thermal expansion of the electronic device 202 has stabilized (converged). Thereby, the contact accuracy between the electronic device 202 and the probes 16 is enhanced.

Further, because, during the inspection of the electronic device 201, the electronic device 202 to be inspected next is heated in advance, the waiting time from the completion of the preparation step S104 of the electronic device 201 to the start of the alignment S106 of the electronic device 202 can be reduced. Thereby, the throughput of the inspection apparatus 10 can be enhanced.

It should be noted that the timing of starting to heat the electronic device 202 is illustrated as being after the start of the inspection step S104 in FIG. 4, but is not limited thereto. The timing of starting to heat the electronic device 202 may be at the same time as the start of the inspection step S104. Also, the timing of starting to heat the electronic device 202 may be prior to the start of the inspection step S104. For example, in a case in which the inspection time of each of the electronic devices 201 to 203 is shorter than the time from the start of heating each of the electronic devices 201 to 203 to the stabilization of the displacement due to thermal expansion, heating of the electronic device 202 may be started prior to the start of inspection step S104 of the electronic device 201.

The controller 19 controls the movement mechanism (not illustrated) of the stage 11 to make contact S107 between an electrode of the electronic device 202 to be inspected and the probes 16. Here, because alignment is performed in accordance with the thermal expansion of the electronic device 202 to be inspected, positional adjustment between the electrode of the electronic device 202 and the probes 16 can be reliably performed. Also, the contact pressure between the electrode of the electronic device 202 and the probes 16 can be set to a preferable pressure.

Next, in the inspection step S108, the tester 14 inspects the electronic device 202, to be inspected, connected through the probes 16. At this time, the controller 19 may control the amount of light of the LED arrays 400 within the illumination area 402 so that the temperature of the electronic device 202 becomes the target temperature based on the detected value of the temperature sensor 34. Upon completion of the inspection of the electronic device 202, the LED arrays 400 of the illumination area 402 are turned off.

Thereafter, the preparation step S109, the chip alignment S110, the contact S111, and the inspection step S112 of the electronic device 203 are similar to the preparation step S105, the chip alignment S106, the contact S107, and the inspection step S108 of the electronic device 202, and the overlapping description is omitted as appropriate.

As described above, according to the inspection apparatus 10 according to the present embodiment, during the inspection of one electronic device 201, the light emission mechanism 40 heats in advance the electronic device 202 to be inspected next. Thereby, the waiting time from the completion of the inspection of the electronic device 201 to the start of the alignment of the electronic device 202 can be reduced and the throughput of the inspection apparatus 10 can be enhanced.

In other words, the electronic device 202 can be aligned after the displacement of the electronic device 202 due to thermal expansion has stabilized (converged). Thereby, the alignment accuracy of the electronic device 202 is enhanced and the contact accuracy between the electronic device 202 and the probes 16 is enhanced.

Also, a preferable positional relationship is that an electronic device during the inspection and an electronic device to be inspected next are arranged next to each other. Thereby, by heating the electronic device during the inspection to be at the target temperature, the adjacent electronic device to be inspected next can also be heated. Thereby, the throughput of the inspection apparatus 10 can be enhanced.

Although the inspection apparatus 10 has been described above, the present disclosure is not limited to the above described embodiment and the like, and various modifications and improvements can be made within the scope of the present disclosure described in claims.

Although the light emission mechanism 40 is included as a heater that is able to heat the stage 11 for each sectioned area in the above description, the present disclosure is not limited thereto. Other types of heaters or the like may be used as a heater that is able to heat the stage 11 for each sectioned area.

What is claimed is:

1. A control method of an inspection apparatus including a mounting stage on which a substrate having a plurality of inspection objects is mounted, a plurality of sections being formed with respect to the mounting stage and a heater controllable to heat for each of the sections, wherein the control method comprises:
heating an entirety of the substrate mounted on the mounting stage to a first target temperature;
causing the heater to start heating of a first section corresponding to a first inspection object to be inspected among the plurality of inspection objects;
controlling the heating of the first section so that the first inspection object is heated to a second target temperature and starting an inspection of the first inspection object, after the start of the heating of the first section; and
causing the heater to start heating of a second section corresponding to a second inspection object to be inspected next before the inspection of the first inspection object is completed.

2. The control method of the inspection apparatus according to claim 1, wherein the second inspection object is arranged next to the first inspection object on the substrate.

3. The control method of the inspection apparatus according to claim 1,
wherein the inspection apparatus includes a temperature sensor configured to detect a temperature of an inspection object, and
wherein when heating a section corresponding to the inspection object, the heater is controlled so that the temperature of the inspection object becomes the second target temperature based on the temperature of the inspection object detected by the temperature sensor.

4. The control method of the inspection apparatus according to claim 3, wherein the inspection apparatus includes a probe that contacts the inspection object to be inspected, the control method further comprising:
upon an elapse of a threshold time after the temperature of the inspection object has stabilized at the second target temperature, determining that displacement of the inspection object with respect to the probe due to thermal expansion has stabilized.

5. The control method of the inspection apparatus according to claim 4, further comprising:
upon determining that the displacement of the inspection object due to the thermal expansion has stabilized, aligning the inspection object.

6. The control method of the inspection apparatus according to claim 5,
wherein after aligning the inspection object, the inspection object and the probe are caused to be in contact with each other.

7. The control method of the inspection apparatus according to claim 1, wherein the heater is a light emission mechanism configured to emit light to heat the mounting stage.

8. The control method of the inspection apparatus according to claim 7, wherein the light emission mechanism includes an LED as a light source.

9. An inspection apparatus comprising:
a mounting stage on which a substrate having a plurality of inspection objects is mounted, a plurality of sections being formed with respect to the mounting stage;
a heater controllable to heat for each of the sections; and
a controller configured to control the heater,
wherein the controller controls to heat an entirety of the substrate mounted on the mounting stage to a first target temperature,
wherein the controller causes the heater to start heating of a first section corresponding to a first inspection object to be inspected among the plurality of inspection objects,
wherein the controller controls the heating of the first section so that the first inspection object is heated to a second target temperature and starts an inspection of the first inspection object, after the start of the heating of the first section; and
wherein the controller causes the heater to start heating of a second section corresponding to a second inspection object to be inspected next before the inspection of the first inspection object is completed.

* * * * *